(12) United States Patent
Dobyns et al.

(10) Patent No.: US 8,161,497 B2
(45) Date of Patent: *Apr. 17, 2012

(54) HOLDOFF ALGORITHM FOR NO DEAD TIME ACQUISITION

(75) Inventors: Kenneth P. Dobyns, Beaverton, OR (US); Roy I. Siegel, Portland, OR (US); Kristie L. Veith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1015 days.

This patent is subject to a terminal disclaimer.

(21) Appl. No.: 12/056,159

(22) Filed: Mar. 26, 2008

(65) Prior Publication Data

US 2009/0249363 A1      Oct. 1, 2009

(51) Int. Cl.
*G06F 3/00* (2006.01)
*G06F 17/00* (2006.01)

(52) U.S. Cl. .......................... 719/318; 715/200
(58) Field of Classification Search .................. 719/318; 715/200

See application file for complete search history.

(56) References Cited

U.S. PATENT DOCUMENTS

| 6,898,261 | B1* | 5/2005 | Hunter et al. | 377/15 |
| 7,610,083 | B2* | 10/2009 | Drew et al. | 600/509 |
| 2003/0208328 | A1 | 11/2003 | Pickerd | |
| 2003/0220753 | A1 | 11/2003 | Pickerd | |
| 2007/0186250 | A1* | 8/2007 | Carey | 725/62 |
| 2007/0222429 | A1* | 9/2007 | Sullivan et al. | 324/76.15 |

FOREIGN PATENT DOCUMENTS

| EP | 0677746 A | 10/1995 |
| EP | 1156338 A | 11/2001 |
| WO | 20070112327 A | 10/2007 |

OTHER PUBLICATIONS

Bjame , What is object-oriented programming,1988.*

* cited by examiner

*Primary Examiner* — Lechi Truong
(74) *Attorney, Agent, or Firm* — Francis I. Gray; Thomas F. Lenihan

(57) ABSTRACT

An improved hold-off algorithm that assures that all data associated with all trigger events in a data signal are displayed uses a designated interval starting with a first trigger event to determine whether any subsequent trigger events occurred within the designated interval. A first display frame is drawn based upon the first trigger event. A next display frame is drawn based either on a next trigger event that occurs outside the designated interval, or based on the last trigger event that occurred within the designated interval. In the latter case the two display frames provide an overlap to assure that no data related to the trigger events is lost on the display.

3 Claims, 3 Drawing Sheets

FIG.6

NO DEAD TIME
HOLDOFF PERIOD

NO DEAD TIME
HOLDOFF PERIOD

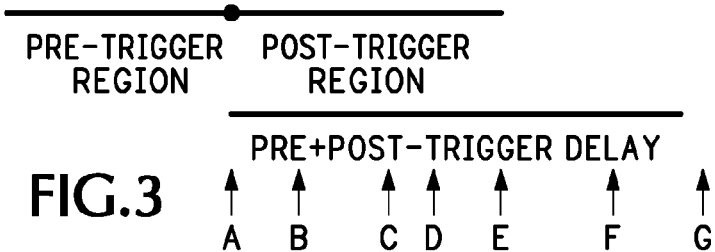
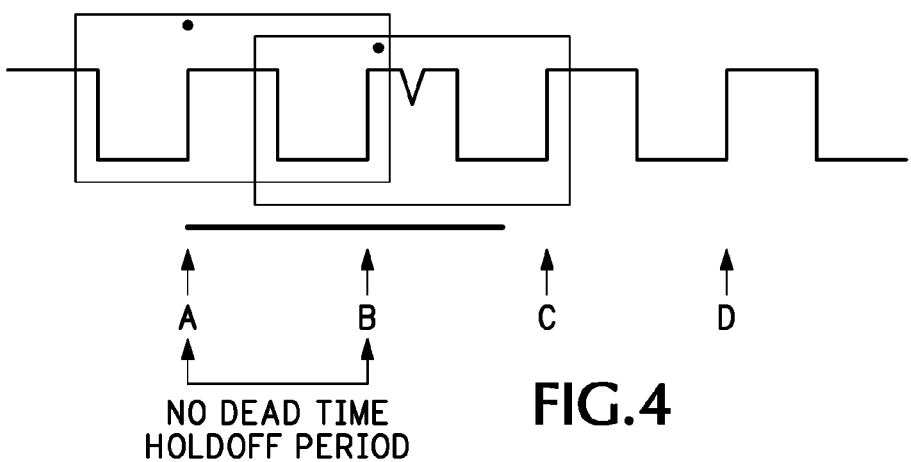
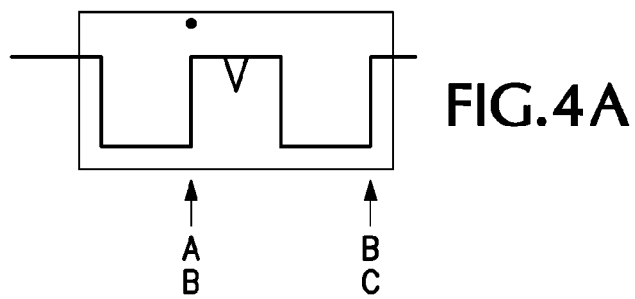
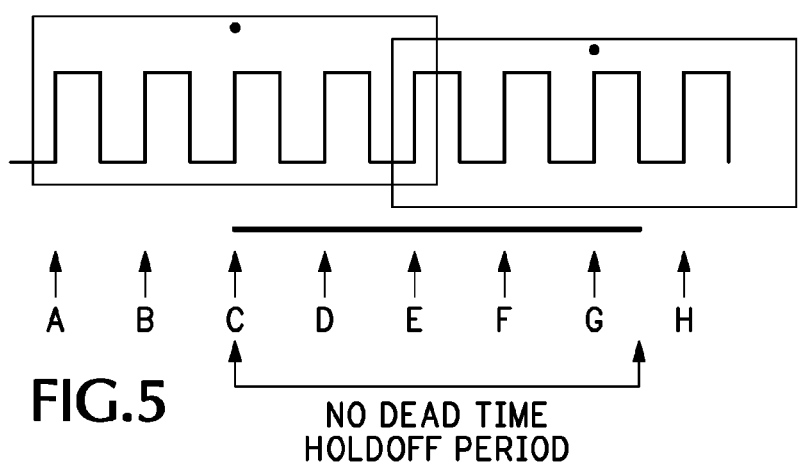

HOLDOFF ALGORITHM FOR NO DEAD TIME ACQUISITION

FIELD OF THE INVENTION

The present invention relates to an acquisition system for a test and measurement instrument, and more particularly to an improved hold-off algorithm.

BACKGROUND OF THE INVENTION

The "dead time" of a measurement instrument, such as an oscilloscope, is a time period during which data acquisition circuitry does not respond to a valid trigger event because the oscilloscope is busy performing other tasks and so is not able to process trigger events that may occur. Consequently, a waveform representing an electrical signal being monitored is not displayed for the missed valid trigger event. In an analog oscilloscope, for example, dead time occurs during the beam retrace time on a cathode ray tube. In a digital oscilloscope, dead time often occurs when the instrument is busy reading data from an acquisition memory associated with a previous acquisition, or busy drawing the acquired processed data to produce an image of the waveform for display.

Circuits under test often operate at rates much faster than a standard digital oscilloscope can display the corresponding waveforms. In fact, the typical digital oscilloscope "ignores" most trigger events because it is busy processing and drawing waveforms relating to data acquired in response to a prior trigger event. It is an unfortunate fact that such electronic circuits under test occasionally work in an unexpected manner. Occurrences of incorrect operation of the circuits under test may be rare, perhaps occurring once in thousands of correct cycles of operation. Thus, the oscilloscope may not acquire data representing waveforms that exhibit the incorrect operation of the circuit under test, i.e., an anomaly, because the oscilloscope may be busy at the instant that the anomaly occurs. An oscilloscope user may have to wait a long time in order to view the incorrect operation. Since only a small fraction of the waveforms are drawn on the oscilloscope display, failure to observe the incorrect operation cannot give the user confidence that the circuit under test is operating properly.

The basic digital oscilloscope has an architecture in which data is received and stored in an acquisition memory, and then acquisition is halted by a trigger event after a defined post-trigger interval. The acquired data then is read from the acquisition memory for processing and waveform drawing on a display before the acquisition system is again enabled to respond to new trigger events.

Co-pending U.S. patent application Ser. No. 11/388,428, filed by Steven Sullivan et al on Mar. 24, 2006 entitled "No Dead Time Data Acquisition", now U.S. Pat. No. 7,652,465, is one attempt to enable the acquisition for display of data representing all trigger events. A measurement instrument receives a digitized signal representing an electrical signal being monitored and uses a fast digital trigger circuit to generate a trigger signal, wherein the trigger signal includes all trigger events within the digitized signal. The digitized signal is compressed as desired and delayed by a first-in, first-out (FIFO) buffer for a period of time (pre-trigger delay) to assure a predetermined amount of data prior to a first trigger event in the trigger signal. The delayed digitized signal from the FIFO is delivered to a fast rasterizer or drawing engine, upon the occurrence of the first trigger event, to generate a waveform image. The waveform image is then provided to a display buffer for combination with prior waveform images and/or other graphic inputs from other drawing engines. The contents of the display buffer are provided on a display screen at a display update rate to show a composite of all waveform images representing the electrical signal.

Two or more drawing engines may be used for each input channel of the measurement instrument to produce two or more waveform images, each waveform image having one of the trigger events at a specified trigger position within a display window. The waveform images are combined to form a composite waveform image containing all the trigger events for combination with the previous waveform images in the display buffer or with graphics from other drawing engines. For certain trigger positions within the display window, an indicator is provided to show that a trigger event may have been missed. Also, when there are no trigger events, a graphic of the signal content may still be provided for the display.

"No dead time" was defined as the ability for the user to see 100% of the trigger events that occur within an input signal on the display. Referring now to FIG. 1 locations A-H represent trigger events within the input signal. In this example, event C is used as a reference for drawing the data contained in the left frame, being placed at the trigger point within the graticule. The above-mentioned '428 U.S. patent application discusses a hold-off period within which trigger events are recognized, but not treated specially. These trigger events are shown on a display to an instrument user as part of the left frame, but do not form the basis for beginning new drawing cycles for these trigger events. Once the no dead time hold-off period is completed, the next trigger event is the focus for a new drawing cycle, in this example being event F which is located at the trigger point within the graticule for the right frame.

There are some problems with this method of defining "no dead time." It is possible for the user to miss important and anomalistic information even while seeing 100% of the trigger events. As the trigger point is moved to the right hand side of the graticule, i.e., the pre-trigger region of the graticule is increased, more and more parallel drawing processes are required to keep up with the incoming trigger events that occur just past the right edge of the screen—practically there are limits to how far the trigger point may be moved toward the right edge of the graticule. Also drawing the same information more than once on screen may result in user confusion, i.e., the data around events D and E are drawn on both the left and right frames in the present example which are superimposed when drawn on a display screen, as shown in FIG. 1A.

As an example of missing important information, refer to FIG. 2 where the user is using edge triggering to look at individual pulses that form a longer pulse train. Reasonably, the user expects the instrument featuring no dead time acquisition to show any anomalies associated with each of the pulses. However this is not necessarily the case. Each of the trigger events, A-D, is shown in either the left or right frame. However, a glitch that is clearly visible in the pulse between trigger events B and C is not shown in either frame, i.e., it is not shown within the graticule on screen, as shown in FIG. 2A, and so is missed by the user. This condition occurs when the time between a first (A) and an Nth trigger event (C) is greater than the sum of the pre- and post-trigger time intervals that define the graticule; and the N−1 trigger event (B) is displayed when drawing the first trigger event. In this event a data "dead zone", as opposed to a trigger event dead zone, may open up between the two processed frames into which information falls that is not drawn on the screen, i.e., in this example data within the post trigger time interval for the B trigger event but outside the pre-trigger interval for the C trigger event.

What is desired is a no dead time acquisition system that includes all trigger events and all data within the pre- and post-trigger time intervals for each of the trigger events.

SUMMARY OF THE INVENTION

Accordingly, the present invention provides an improved hold-off algorithm for processing data to assure that all data associated with all trigger events within the data are displayed. When a first trigger event occurs, a first display frame is drawn and a designated interval is started. If a subsequent trigger event occurs prior to the expiration of the designated interval, then at the expiration of the designated interval the last trigger event to occur is used for drawing a next display frame which provides for overlap between the two display frames to assure that no data is missed related to the detected trigger events. If there are no trigger events during the designated interval, then the next display frame is drawn when the next trigger event occurs.

The objects, advantages and other novel features of the present invention are apparent from the following detailed description when read in conjunction with the appended claims.

BRIEF DESCRIPTION OF THE DRAWING

FIG. 3 is a graphic view illustrating the improved no dead time hold-off algorithm according to the present invention.

FIG. 4 is a plan view of the signal waveform of FIG. 2 displayed within two display frames according to the improved no dead time hold-off algorithm of the present invention, and FIG. 4A is the corresponding display screen.

FIG. 5 is a plan view of the signal waveform represented in FIG. 1 displayed within two display frames according to the improved no dead time hold-off algorithm of the present invention.

DETAILED DESCRIPTION OF THE DRAWING

Figure 2:
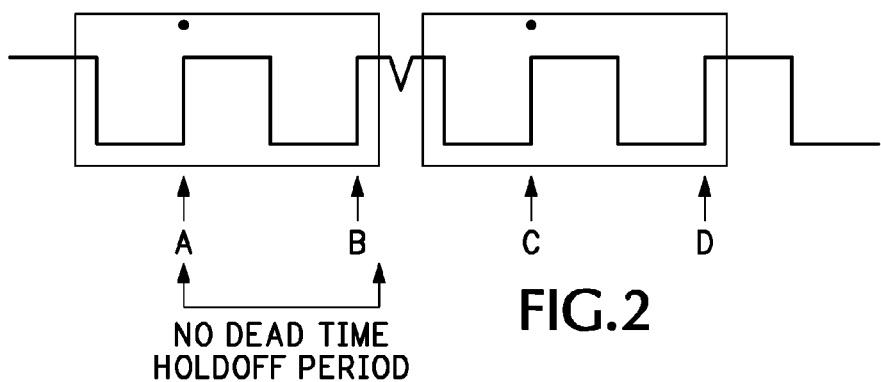
FIG. 2 is a plan view of a signal waveform displayed within two non-overlapping display frames according to the no dead time processing algorithm.
Figure 2A:
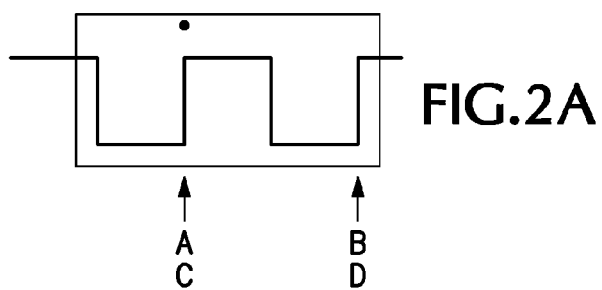
FIG. 2A is the corresponding display screen.

Referring now to FIG. 3, a time line is shown about a trigger point that includes a pre-trigger region and a post-trigger region, corresponding to the pre- and post-trigger time intervals that define a graticule in a display frame. The improved hold-off algorithm, as described herein, starts a time interval from the trigger point that is equivalent to the sum of the pre- and post-trigger time intervals or data window interval. During the data window interval, all triggers that occur after the initial trigger event, A, represented by the trigger point within the display frame, i.e., trigger events B-F, are recorded in a buffer. Once the data window interval expires, a controller determines if there have been any other trigger events that occurred during the data window interval. If there have been no trigger events after the initial trigger event, A, within the data window interval, then the next display frame places the next trigger event at the trigger point of the next display frame. Otherwise the next display frame places the last prior trigger event, F, within the data window interval for the first display frame at the trigger point of the next display frame. FIG. 4 shows the new hold-off algorithm as applied to the waveform of FIG. 2 where trigger event B occurs before the completion of the data window interval and prior to trigger event C that occurs after the data window interval. In this way the glitch that went undetected under the old hold-off algorithm is now presented to the user on the display, as shown in FIG. 4A.

Figure 1:
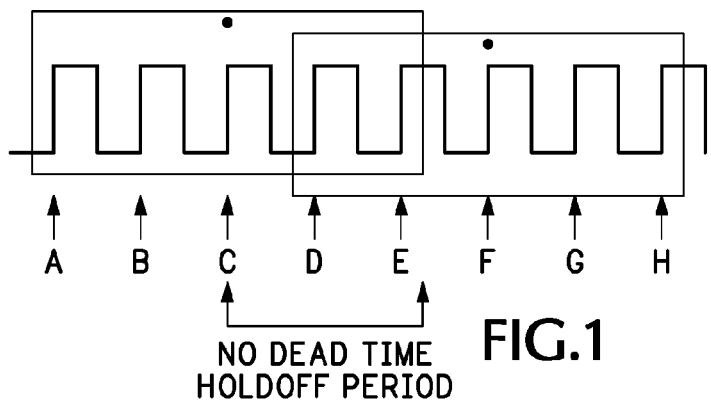
FIG. 1 is a plan view of a signal waveform displayed within two overlapping display frames according to a no dead time processing algorithm.
Figure 1A:
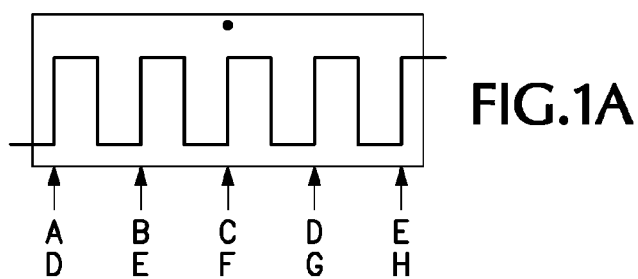
FIG. 1A is the corresponding display screen.
Figure 5A:
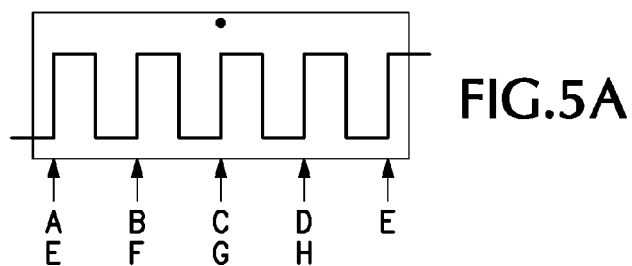
FIG. 5A is the corresponding display screen.

FIG. 5 is a comparable view to that of FIG. 1, however presenting the trigger events so the screen display minimizes overlap, as shown in FIG. 5A. As is apparent all the trigger events together with their corresponding pre- and post-trigger regions are presented on the display.

Figure 6:
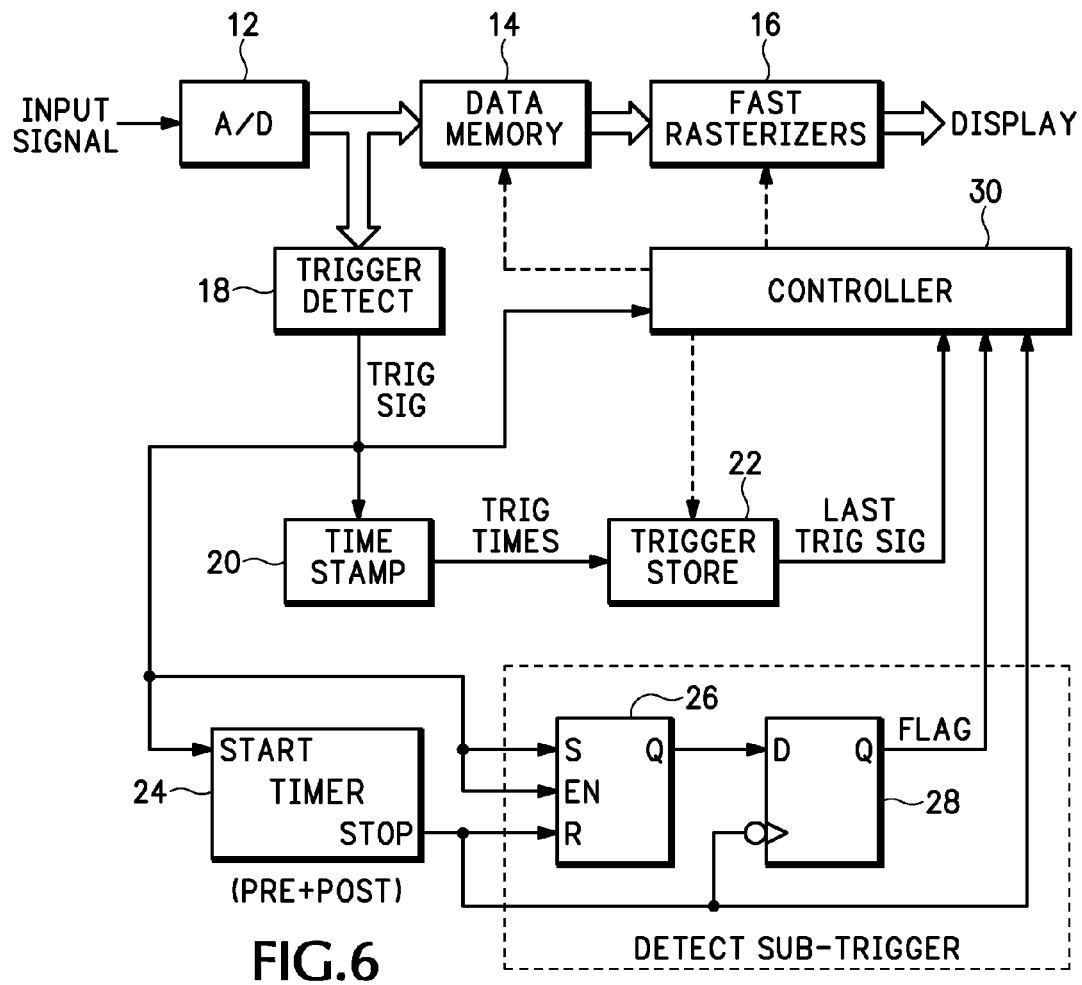
FIG. 6 is a block diagram view of circuitry for implementing the improved no dead time hold-off algorithm according to the present invention.

FIG. 6 represents one embodiment of circuitry that enables the use of the hold-off algorithm described above. The input signal, whether a realtime signal or a previously acquired signal (in which case the A/D converter is bypassed), is digitized by an A/D converter 12 and stored in a data memory 14. The data memory 14 has a capacity that encompasses at least two display frames of data. The digitized data from the data memory 14 are input to fast rasterizers 16, only two of which are now necessary to encompass all display trigger positions on the display, for drawing of the waveform images for the display. A trigger detection circuit 18 generates a trigger signal from the digitized data that encompasses all trigger events within the input signal. Each trigger event within the trigger signal is time-stamped (20) and the trigger times are input to a trigger store 22, each subsequent trigger time overwriting the previous trigger time.

The first trigger event in the trigger signal, which is positioned at the designated trigger point within the first display frame, starts an interval timer 24. The interval timer 24 counts the interval equal to the designated sum of the pre- and post-trigger delays, i.e., the data window interval. The first trigger event in the trigger signal also enables a set-reset flip-flop 26, which is reset by the interval timer 24 after the data window interval times out. If a subsequent trigger event occurs in the trigger signal prior to the conclusion of the data window interval, the set-reset flip-flop 26 is set. When the data window interval times out, a D-type flip-flop 28 samples the output of the set-reset flip-flop 26 to ascertain whether any additional trigger events after the first trigger event occurred during the data window interval. If any additional trigger events occurred, then a flag is set and sent to a controller 30. The controller 30, in response to the flag signal, takes the trigger event time from the trigger store 22 that corresponds to the last trigger event that occurred prior to the expiration of the data window interval, and uses the extracted trigger event time for drawing the next display frame. The controller 30 uses the extracted trigger event time to generate an address for the data memory 14 from which the data is forwarded to the fast rasterizers 16 for drawing the next display frame. In the absence of the flag signal the controller 30 uses the next trigger event that occurs after the expiration of the data window interval to draw the next display frame.

A specific embodiment is described for the purpose of illustration only, and the above-described hold-off algorithm may be executed completely by software or by other hardware configurations that produce the same result.

Thus, the present invention provides an improved hold-off algorithm for processing an input signal to assure that all data within the pre- and post-trigger time intervals for all trigger events in the input signal are processed for display. The hold-off algorithm uses a designated interval equal to the sum of specified pre- and post-trigger delays to detect trigger events that occur during the designated interval to generate a flag signal. In response to the flag signal a next display frame is drawn based upon either the last trigger event to occur during the designated interval (flag SET) or the next trigger event that occurs after the designated interval (flag/SET).

What is claimed is:

1. A method, for use in an oscilloscope, of capturing for display all data associated with all trigger events within an input signal under test, comprising steps of:
   detecting, in trigger detection circuitry, the trigger events within the input signal to generate a trigger signal;
   drawing, on a display screen of said oscilloscope, a first display frame for the input signal based upon a first trigger event within the trigger signal; and
   drawing, on said display screen of said oscilloscope, a second display frame for the input signal based upon a subsequent trigger event within the trigger signal after the first trigger event, the second display frame having minimal overlap with the first display frame when the subsequent trigger event occurs within a designated interval after the first trigger event and the data associated with the trigger events within the first display frame are captured for display;
   said drawing of said first and second display frames on said display screen being controlled by a controller, and including said display of all data associated with all trigger events within said input signal under test;
   wherein the designated interval comprises a sum of a desired pre-trigger time interval and a desired post-trigger time interval, the designated interval starting when the first trigger event occurs.

2. An oscilloscope comprising:
   processor;
      a trigger detection circuit executed on the processor and having as an input an input signal and having as an output a trigger signal that includes all trigger events within the input signal;
      a first drawing engine having as an input a delayed version of the input signal and having as an output a first display frame based upon a first trigger event within the trigger signal; and
   a second drawing engine having as an input the delayed version of the input signal and having as an output a second display frame based upon a subsequent trigger event within the trigger signal, the second display frame having minimal overlap with the first display frame when the subsequent trigger event occurs within a designated interval after the first trigger event and data associated with the trigger events within the first display frame are captured for display;
   a display screen for displaying representations of said input signal under test; and
   a controller, said controller controlling the drawing of said first and second display frames on said display screen, said drawing of said first and second display frames including said display of all data associated with all trigger events within said input signal under test;
   wherein the designated interval comprises a sum of a desired pre-trigger time interval and a desired post-trigger time interval, the designated interval starting when the first trigger event occurs.

3. An oscilloscope comprising:
processor;
   a trigger detection circuit executed on the processor and having as an input an input signal and having as an output a trigger signal that includes all trigger events within the input signal;
   a first drawing engine having as an input a delayed version of the input signal and having as an output a first display frame based upon a first trigger event within the trigger signal; and
   a second drawing engine having as an input the delayed version of the input signal and having as an output a second display frame based upon a subsequent trigger event within the trigger signal, the second display frame having minimal overlap with the first display frame when the subsequent trigger event occurs within a designated interval after the first trigger event and data associated with the trigger events within the first display frame are captured for display;
   a display screen for displaying representations of said input signal under test; and
   a controller, said controller controlling drawing of said first and second display frames on said display screen, said drawing of said first and second display frames including said display of all data associated with all trigger events within said input signal under test; and
further comprising an interval timer coupled to receive the trigger signal, the interval timer starting with receipt of the first trigger event and stopping when the designated interval times out;
   a detector having as inputs the trigger signal and a stop output from the interval timer, and having a flag output, the flag output being set when the subsequent trigger event occurs within the designated interval; a trigger store coupled to receive a time stamp for each trigger event within the trigger signal; and
   a controller having as inputs the trigger signal, the time stamp from the trigger store for the subsequent trigger, the flag output from the detector, and the stop output from the interval timer, the controller starting the first drawing engine upon receipt of the first trigger event and starting the second drawing engine upon receipt of the subsequent trigger event so that, when the flag output is set, the second display frame minimally overlaps the first display frame and the data from the delayed input signal associated with the trigger events within the first display frame are captured for display.

* * * * *